United States Patent
Asenov

(10) Patent No.: US 9,190,485 B2
(45) Date of Patent: Nov. 17, 2015

(54) FLUCTUATION RESISTANT FDSOI TRANSISTOR WITH IMPLANTED SUBCHANNEL

(71) Applicant: Gold Standard Simulations Ltd., Glasgow (GB)

(72) Inventor: Asen Asenov, Glasgow (GB)

(73) Assignee: Gold Standard Simulations Ltd., Glasgow, Scotland (GB)

(*) Notice: Subject to any disclaimer, the term of this patent is extended or adjusted under 35 U.S.C. 154(b) by 0 days.

(21) Appl. No.: 13/950,834

(22) Filed: Jul. 25, 2013

(65) Prior Publication Data

US 2014/0027854 A1 Jan. 30, 2014

Related U.S. Application Data

(60) Provisional application No. 61/676,935, filed on Jul. 28, 2012.

(51) Int. Cl.
| | |
|---|---|
| *H01L 29/66* | (2006.01) |
| *H01L 29/78* | (2006.01) |
| *H01L 29/49* | (2006.01) |
| *H01L 29/10* | (2006.01) |

(52) U.S. Cl.
CPC ...... *H01L 29/66477* (2013.01); *H01L 29/1041* (2013.01); *H01L 29/4983* (2013.01); *H01L 29/66545* (2013.01); *H01L 29/66621* (2013.01); *H01L 29/66651* (2013.01); *H01L 29/78* (2013.01); *H01L 29/7833* (2013.01)

(58) Field of Classification Search
CPC ................................................ H01L 29/66492
USPC .......................................................... 257/330
See application file for complete search history.

(56) References Cited

U.S. PATENT DOCUMENTS

| | | |
|---|---|---|
| 5,298,452 A | 3/1994 | Meyerson |
| 5,314,547 A | 5/1994 | Heremans et al. |
| 5,316,958 A | 5/1994 | Meyerson |
| 6,180,978 B1 | 1/2001 | Chatterjee et al. |
| 6,479,866 B1 | 11/2002 | Xiang |
| 6,566,734 B2 | 5/2003 | Sugihara et al. |
| 6,627,488 B2 | 9/2003 | Lee |

(Continued)

FOREIGN PATENT DOCUMENTS

| | | |
|---|---|---|
| EP | 936676 A2 * | 8/1999 |
| WO | WO-2009/053327 | 4/2009 |
| WO | WO-2013/027092 | 2/2013 |

OTHER PUBLICATIONS

"Office Action Dated May 7, 2014; U.S. Appl. No. 13/424,727", (May 7, 2014).

(Continued)

*Primary Examiner* — Ajay K Arora
(74) *Attorney, Agent, or Firm* — Blakely Sokoloff Taylor & Zafman LLP

(57) ABSTRACT

The structure, and fabrication method thereof, implements a fully depleted silicon-on-insulator (SOI) transistor using a "Channel Last" procedure in which the active channel is a low-temperature epitaxial layer in an etched recess in the SOI silicon film. A highly localized ion implantation is used to set the threshold voltage of the transistor and to improve the short channel behavior of the final device. Based on high-K metal gate technology, this transistor has reduced threshold uncertainty and superior source and drain conductance.

30 Claims, 9 Drawing Sheets

(56) References Cited

U.S. PATENT DOCUMENTS

| | | | |
|---|---|---|---|
| 6,630,710 B1 | 10/2003 | Augusto | |
| 6,667,200 B2 | 12/2003 | Sohn et al. | |
| 6,812,157 B1 | 11/2004 | Gadgil | |
| 7,023,068 B1 | 4/2006 | Hopper et al. | |
| 7,045,407 B2 | 5/2006 | Keating et al. | |
| 7,459,752 B2 | 12/2008 | Doris et al. | |
| 7,589,347 B2 | 9/2009 | Nash et al. | |
| 7,906,413 B2 | 3/2011 | Cardone et al. | |
| 8,273,617 B2 | 9/2012 | Thompson et al. | |
| 8,748,986 B1* | 6/2014 | Shifren et al. | 257/348 |
| 2001/0009292 A1 | 7/2001 | Nishinohara et al. | |
| 2002/0001930 A1* | 1/2002 | Lee | 438/585 |
| 2002/0029372 A1 | 3/2002 | Lee | |
| 2002/0037619 A1 | 3/2002 | Sugihara et al. | |
| 2003/0211681 A1 | 11/2003 | Hanafi et al. | |
| 2004/0201063 A1* | 10/2004 | Fukuda | 257/347 |
| 2004/0206980 A1 | 10/2004 | Cheong et al. | |
| 2006/0022270 A1 | 2/2006 | Boyd et al. | |
| 2006/0046399 A1* | 3/2006 | Lindert et al. | 438/282 |
| 2006/0113605 A1 | 6/2006 | Currie | |
| 2008/0001237 A1 | 1/2008 | Chang et al. | |
| 2008/0017887 A1 | 1/2008 | Nagata et al. | |
| 2009/0321820 A1 | 12/2009 | Yamakawa | |
| 2009/0321849 A1 | 12/2009 | Miyamura et al. | |
| 2010/0237433 A1 | 9/2010 | Zampardi et al. | |
| 2011/0073961 A1 | 3/2011 | Dennard et al. | |
| 2011/0074498 A1 | 3/2011 | Thompson et al. | |
| 2011/0212583 A1 | 9/2011 | Neudeck | |
| 2011/0260220 A1 | 10/2011 | Chi et al. | |
| 2013/0001706 A1 | 1/2013 | Haran et al. | |

OTHER PUBLICATIONS

"International Search Report and Written Opinion of the International Searching Authority Dated Nov. 9, 2012, International Application No. PCT/IB2012/001068", (Nov. 9, 2012).
"International Search Report and Written Opinion of the International Searching Authority Dated Nov. 9, 2012, International Application No. PCT/IB2012/001069", (Nov. 9, 2012).
"International Search Report and Written Opinion of the International Searching Authority Dated Nov. 13, 2013, International Application No. PCT/IB2013/001637", (Nov. 13, 2013).
"Office Action Dated Aug. 13, 2013; U.S. Appl. No. 13/424,745", (Aug. 13, 2013).
"Office Action Dated Nov. 22, 2013; U.S. Appl. No. 13/424,727", (Nov. 22, 2013).
"Office Action Dated Oct. 24, 2013; U.S. Appl. No. 13/424,745", (Oct. 24, 2013).
Asenov, Asen , "Random Dopant Threshold Voltage Fluctuations in 50nm Epitaxial Channel MOSFETs: A 3D 'Atomisitc' Simulation Study", *ESSDERC '98: 28th Conference on European Solid-State Devices*, Bordeax, France, (Sep. 8-10, 1998), pp. 300-303.
Asenov, Asen , et al., "Suppression of Random Dopant-Induced Threshold Voltage Fluctuations in Sub-0.1-μm MOSFET's with Epitaxial and δ-Doped Channels", *IEEE Transactions on Electron Devices*, vol. 46, No. 8, (Aug. 1999), pp. 1718-1724.
Bruel, M. , "Silicon on insulator material technology", *Electronics Letters*, vol. 31, No. 14, (Jul. 6, 1995), pp. 1201-1202.
Colinge, Jean-Pierre , "Hot-Electron Effects in Silicon-On-Insulator n-Channel MOSFET's", *IEEE Transactions on Electron Devices*, vol. ED-34, No. 10, (Oct. 1987), pp. 2173-2177.
Courtland, Rachel , "Start-up Seeks New Life for Planar Transistors, SuVolta is pursuing precision doping in its bid to compete with 3-D transistor technology", *ieee spectrum tech alert*, (Dec. 8, 2011), 3 pp. total.
Frank, Martin M., "High-k / Metal Gate Innovations Enabling Continued CMOS Scaling", *2011 Proceedings of the ESSCIRC*, (Sep. 12-16, 2011), pp. 50-58.

Fu, Y. , et al., "Subband structure and ionized impurity scattering of the two dimensional electron gas in δdoped field effect transistor", *Journal of Applied Physics*, vol. 78, No. 5, (Sep. 1, 1995), pp. 3504-3510.
Fujita, K. , et al., "Advanced Channel Engineering Achieving Aggressive Reduction of $V_T$ Variation for Ultra-Low-Power Applications", *Electron Devices Meeting (IEDM), 2011 IEEE International*, (Dec. 2011), pp. 32.3.1-32.3.4.
Hokazono, Akira, et al., "25-nm Gate Length nMOSFET With Steep Channel Profiles Utilizing Carbon-Doped Silicon Layers (A P-Type Dopant Confinement Layer)", *IEEE Transactions on Electron Devices*, vol. 58, No. 5, (May 2011), pp. 1302-1310.
Kuhn, Kelin J., et al., "Process Technology Variation", *IEEE Transactions on Election Devices*, vol. 58, No. 8, (Aug. 2011), pp. 2197-2208.
Maleville, Christophe , "Extending planar device roadmap beyond node 20nm through ultra thin body technology", *2011 International Symposium on VLSI Technology, Systems and Applications (VLSI-TSA)*, (Apr. 25-27, 2011), pp. 1-4.
Markov, Stanislov , et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.
Meyer, J. E., et al., "High Performance, Low Power CMOS Memories Using Silicon-On-Sapphire Technology", *1971 International Electron Devices Meeting*, (1971), p. 44.
Noda, Kenji , et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.
Pawlak, B. J., et al., "Effect of amorphization and carbon co-doping on activation and diffusion of boron in silicon", *Applied Physics Letters*, 89, 062110, (2006), pp. 062110-1 to 062110-3.
Pawlak, B. J., et al., "Suppression of phosphorus diffusion by carbon co-implantation", *Applied Physics Letters*, 89, 062102, (2006), pp. 062102-1 to 062102-3.
Roy, G. , et al., "Random dopant fluctuation resistant 'bulk' MOSFETs with epitaxial delta doped channels", *Ultimate Integration in Silicon (ULIS) Conference*, Glasgow, Scotland, (2007), 4 pp. total.
Takeuchi, Kiyoshi , et al., "Channel Engineering for the Reduction of Random-Dopant-Placement-Induced Threshold Voltage Fluctuation", *1997 International Electron Devices Meeting (IEDM)*, Technical Digest, (Dec. 7-10, 1997), pp. 841-844.
"Office Action Dated May 15, 2015; U.S. Appl. No. 13/950,810", (May 15, 2015).
"Office Action Dated May 8, 2015; U.S. Appl. No. 14/664,595", (May 8, 2015).
"Notice of Allowance Dated Dec. 19, 2014; U.S. Appl. No. 14/323,177", (Dec. 19, 2014).
"Notice of Allowance Dated Nov. 14, 2014; U.S. Appl. No. 13/424,727", (Nov. 14, 2014).
"Office Action Dated Oct. 24, 2014; U.S. Appl. No. 13/950,868", (Oct. 24, 2014).
"Office Action Dated Oct. 3, 2014; U.S. Appl. No. 13/950,810", (Oct. 3, 2014).
"Office Action Dated Jul. 7, 2014; U.S. Appl. No. 13/424,745", (Jul. 7, 2014).
"Office Action Dated Jul. 8, 2014; U.S. Appl. No. 13/950,810", (Jul. 8, 2014).
"Office Action Dated Jul. 8, 2014; U.S. Appl. No. 13/950,868", (Jul. 8, 2014).
Asenov, Asen , "Random Dopant Induced Threshold Voltage Lowering and Fluctuations in Sub-0.1 μm MOSFET's: A 3-D "Atomistic" Simulation Study", *IEEE Transactions on Electron Devices*, vol. 45, No. 12, (Dec. 1998), pp. 2505-2513.
"Office Action Dated Aug. 25, 2015; U.S. Appl. No. 13/424,745", (Aug. 25, 2015).
"Office Action Dated Jul. 1, 2015; U.S. Application No. 13/950,868", (Jul. 1, 2015).

\* cited by examiner

FLUCTUATION RESISTANT FDSOI TRANSISTOR WITH IMPLANTED SUBCHANNEL

CROSS-REFERENCE TO RELATED APPLICATIONS

This application claims the benefit of U.S. Provisional Patent Application No. 61/676,935 filed Jul. 28, 2012.

BACKGROUND OF THE INVENTION

1. Field of the Invention

The present invention generally relates to the manufacturing of metal-oxide-semiconductor field effect transistors (MOSFETs), and more particularly to transistors fabricated in thin films over an insulating layer. Even more specifically, this invention deals with those instances where random variations of the threshold voltages of such transistors adversely affect integrated circuit performance.

2. Prior Art

MOS transistors have long been troubled by the adverse effects of their underlying substrates, like parasitic capacitance and area-consuming isolation. In the earliest days of integrated circuit technology, the use of a thin film of silicon on a sapphire substrate was proposed as a solution to these problems. RCA Laboratories was an early proponent of this technology, as in Meyer, J. E.; Boleky, E. J.; "High performance, low power CMOS memories using silicon-on-sapphire technology," *Electron Devices Meeting,* 1971 *International*, vol. 17, p. 44, 1971. The basic ideas of this technology have evolved over the years driven by improvements in materials technology, and as less exotic substrates became practical, this technology became known as silicon-on-insulator (SOI). In the earliest implementations, the silicon was simply a very thin, i.e., less than 1 micron thick, substrate with a conventional level of doping and a depletion layer beneath the transistor's gate. This depletion layer is thinner than the silicon thickness, resulting in 'partially depleted' SOI (PD SOI). The un-depleted doped region beneath the gate of a PD SOI transistor proved to have its own disadvantages, largely caused by its tendency to charge and discharge resulting in step changes in the drain current. These problems became known as a "kink" effect, and it was closely tied to the behavior of hot electrons from the transistor's channel.

The next stage in silicon-on-insulator evolution was the fully-depleted film. This was achieved by making the silicon beneath the gate so thin that there would be no region where there would be mobile carriers. Some of the early work was done at HP Laboratories and reported as Colinge, J.-P.; "Hot-electron effects in Silicon-on-insulator n-channel MOSFET's," *Electron Devices, IEEE Transactions on*, vol. 34, no. 10, pp. 2173-2177, October 1987. In this work, the silicon film is thinner by a factor of 10, only 100 nm thick.

The next step in fully depleted silicon-on-insulator technology has been prompted by the emergence of threshold voltage variations that are associated with the uncertainty of the number of discrete doping ions immediately beneath the gate. This uncertainty is similar to shot noise, because it is an irreducible, statistical uncertainty. For large devices, the counting uncertainty, roughly proportional to the square root of the total number of ions, was never a problem. However, in a world where devices have dimensions of the order of 30 nm, the total number of doping ions drops below 1000, and the counting uncertainty is about 3%, rising to 10% for smaller devices. These deviations are devastating when billions of transistors are integrated into a single integrated circuit chip.

The immediate solution required eliminating all doping from the silicon layer, placing all the responsibility for threshold control on the relative work functions of the gate material, now a metal, and the silicon film. This has been done with both planar and FinFET transistor structures. A good review of this work may be found in Kuhn, K. J.; Giles, M. D.; Becher, D.; Kolar, P.; Kornfeld, A.; Kotlyar, R.; Ma, S. T.; Maheshwari, A.; Mudanai, S.; "Process Technology Variation," *Electron Devices, IEEE Transactions on*, vol. 58, no. 8, pp. 2197-2208, August 2011.

Planar transistors at 32/28 nm CMOS technology generation manufactured to have good electrostatic integrity and resistance to doping fluctuations must employ extremely thin silicon layers, of the order of 7 nm, and they are fabricated over thin buried oxide layers, roughly 10 nm thick. This is discussed in detail in Maleville, C.; "Extending planar device roadmap beyond node 20 nm through ultra thin body technology," *VLSI Technology, Systems and Applications* (VLSI-TSA), 2011 *International Symposium on*, pp 0.1-4, 25-27 Apr. 2011. Layers in the sub-10 nm thickness range present manufacturing challenges, and the very thin layers have an adverse effect on performance because the parasitic series resistance in sources and drains cuts down on the transistors' gain figures. The limited number of dopants, particularly in the access regions below the spacer also introduce variability to access resistance and on-current, as published by S. Markov, S; Cheng, B.; Asenov, A.; "Statistical variability in fully depleted SOI MOSFETs due to random dopant fluctuations in the source and drain extensions," *IEEE Electron Dev. Let*. Vol. 33, pp. 315-317 (March, 2012).

There have been a variety of publications that address the use of an undoped or lightly doped epitaxial channel region to mitigate the fluctuations associated with random doping variations. The publications include Takeuchi, K.; Tatsumi, T.; Furukawa, A.; "Channel engineering for the reduction of random-dopant-placement-induced threshold voltage fluctuation," *Electron Devices Meeting,* 1997. IEDM '97. *Technical Digest., International*, pp. 841-844, 7-10 Dec. 1997; Asenov, A.; Saini, S.; "Suppression of random dopant-induced threshold voltage fluctuations in sub-0.1-μm MOSFET's with epitaxial and δ-doped channels," *Electron Devices, IEEE Transactions on*, vol. 46, no. 8, pp. 1718-1724, August 1999; and Thompson; Scott E.; Thummalapally; Damodar R.; "Electronic Devices and Systems, and Methods for Making and Using the Same," U.S. Patent Application 2011/0074498, Mar. 31, 2011. All these publications address the use of epitaxy in the channels of bulk transistors.

FIG. 1 shows a schematic representation of conventional, fully-depleted silicon on insulator transistor. This figure is prior art. The transistor in FIG. 1 is fabricated on a substrate 10, with a buried oxide 11 separating all components of the transistor from the underlying substrate 10. The active region 13 is doped at a level that permits the active region to be totally free of carriers when there is no applied voltage difference between the gate 15 and 16 and the source, one of either region marked 19. This is made possible because a metal gate 15 has been chosen to have a work function which establishes the appropriate electrostatic potentials within the silicon channel region 13. The gate region 16 comprises a robust material like polycrystalline silicon. It permits fabrication of spacers, contact holes and inter-layer dielectric. Normally in the fabrication of such a transistor, there is a protective oxide 17 which is removed and replaced by a thin, high dielectric constant stack identified as 14. On each side of the gate structure comprising elements 14, and 16, there is a spacer 18. Typically, this spacer is a robust dielectric like silicon nitride that has been etched anisotropically to leave walls of finite thickness on each side of the gate structure. Because of the limitations in FDSOI transistors, the total thickness of region 13 and that part of region 19 that lies beneath the spacer is the same, 4 nm to 8 nm in advanced technologies. The transistor described in FIG. 1 suffers from the limitations described hereinabove.

While the use of prior art FDSOI structures eliminates threshold voltage variations associated with random doping fluctuations, that advantage vanishes when doping is used to adjust threshold voltages. Further, the prior art transistors are subject to variations associated with the randomness of the drain-channel interface, and their source and drain conductances are limited by the very thin film thickness.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Figure 1:
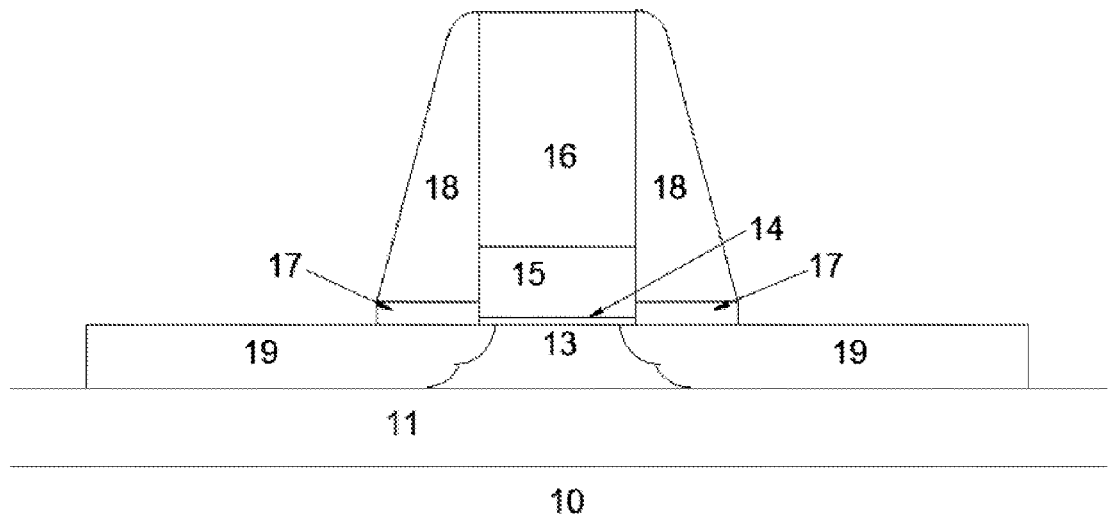
FIG. 1 is a schematic cross section of a prior art fully depleted SOI transistor (prior art).

The structure, and fabrication method thereof, implements a fully depleted silicon-on-insulator (SOI) transistor using a "Channel Last" procedure in which the active channel is a low-temperature epitaxial layer in an etched recess in the SOI silicon film. A highly localized ion implantation is used to set the threshold voltage of the transistor and to improve the short channel behavior of the final device. Based on high-K metal gate technology, this transistor has reduced threshold uncertainty and superior source and drain conductance.

Embodiments of the invention achieve extremely low random variability in fully depleted SOI transistors by modifying the transistor structure to substantially reduce the variations associated with random doping fluctuations and allow the use of thicker films while offering means for threshold voltage control by doping. Further, this invention addresses a second source of fluctuations, those associated with the uncertainty of the location of the PN junctions that separate sources and drains from the bodies of their respective transistors. This is achieved by creating fully-depleted SOI transistors using a "Channel Last" process. This process and its resulting structure present several advantages, including reduced threshold variations, thicker silicon and buried oxide films, and process means for defining a variety of threshold voltages.

The new structure differs from the prior art in the physical and electrical structure of the channel region of the thin-film, silicon-on-insulator transistor. This is illustrated in the exemplary and non-limiting FIG. 2. As before, the transistor is supported by a substrate 20 and a buried oxide 21. Instead of a single channel region, this transistor has a channel region made up of a thin layer 22, which is doped to a designed level by ion implantation, and an epitaxial region 23, which is very lightly doped, i.e., less than $10^{17}$ doping ions/cm$^3$ and preferably less than $10^{16}$ doping ions/cm$^3$. The extent of the channel regions 22 and 23 along an axis passing between the source/drain electrodes 29 is essentially identical to the span between the spacers 28. The transistor is completed by a high-K gate stack 24, a metallic gate with controlled work function 25 and a robust gate handle 26, typically amorphous or polycrystalline silicon. Regions 27 are residual patches of protective oxide from early stages of the process.

The role of the heavy doping in region 22 is to provide electrostatic control of the threshold voltage. As illustrated here, that region has a thickness of 5 nm, and it is doped to a density of approximately $2\times10^{19}$ ions per cm$^3$. This means that there are $1\times10^{13}$ ions per cm$^2$ in layer 22. These parameters are exemplary and not limiting. For an NMOS transistor, the dopants in that layer are acceptor ions, like boron or indium. For a PMOS transistor, the dopants in layer 22 are donors like phosphorus, arsenic or antimony. By adjusting the doping density in layer 22, it is possible to tune the threshold voltage to a higher or lower value, so the doping density cited above can be varied from essentially zero to around $1\times10^{20}$ ions/cm$^3$. In order to realize the full benefits of this structure, it is important to build the device so the boundary between region 22 with its high doping and region 23 with its low doping is abrupt and diffusion of dopants from region 22 into region 23 is kept to a minimum. The practical effect of this constraint is that all high temperature processing has to be completed before the boundary between regions 22 and 23 is defined.

A typical thickness for the undoped epi region 23 is 10 nm, but it can reasonably range from 5 nm to 15 nm. The total thickness of the silicon as it passes between the spacers 28 and the buried oxide 21 is the sum of the thicknesses of regions 22 and 23. This value, which can range from 10 to 25 nm, is thicker than the typical FDSOI transistor, where the thickness might range from 4 nm to 8 nm depending upon the generation and transistor design. The added thickness allows for higher conductivity beneath the spacers 18 and less statistical variation in that conductivity.

Adjacent to region 23 is the gate dielectric 24, and for this class of transistor, that dielectric is expected to be a high-K dielectric stack. While silicon dioxide has a dielectric constant K of 3.9, a high-K dielectric stack has an effective dielectric constant of 6 or more. Oxides or oxynitrides of hafnium are typical constituents of the high-K stack, along with thin transition layers to minimize surface states. On top of the gate dielectric, there is a metallic gate 25, and its composition is chosen for both its manufacturability and its work function. While TiN is a frequent choice, many other metals, alloys and metallic compounds can be used to realize a work-function appropriate to the transistors performance objectives.

The gate structure is completed by a gate "handle" 26, which provides both electric contact and physical protection for the underlying metal gate 25. The gate handle 26 is typically formed from amorphous or polycrystalline silicon.

The transistor structure is completed with sources and drains 29, which are heavily doped regions providing current paths to the active channel that can be induced in region 23 near the gate dielectric 24. There are a variety of approaches to forming the source and drain regions, like simple heavy doping with arsenic or phosphorus for NMOS, boron or indium for PMOS. Other approaches include adding epitaxial silicon or silicon-germanium (heavily doped) to enhance the conductivity of the sources and drains 29 by making them thicker. Also, the sources and drains have their conductance enhanced by the addition of a layer of metal silicide; nickel silicide is frequently used.

Figure 2:
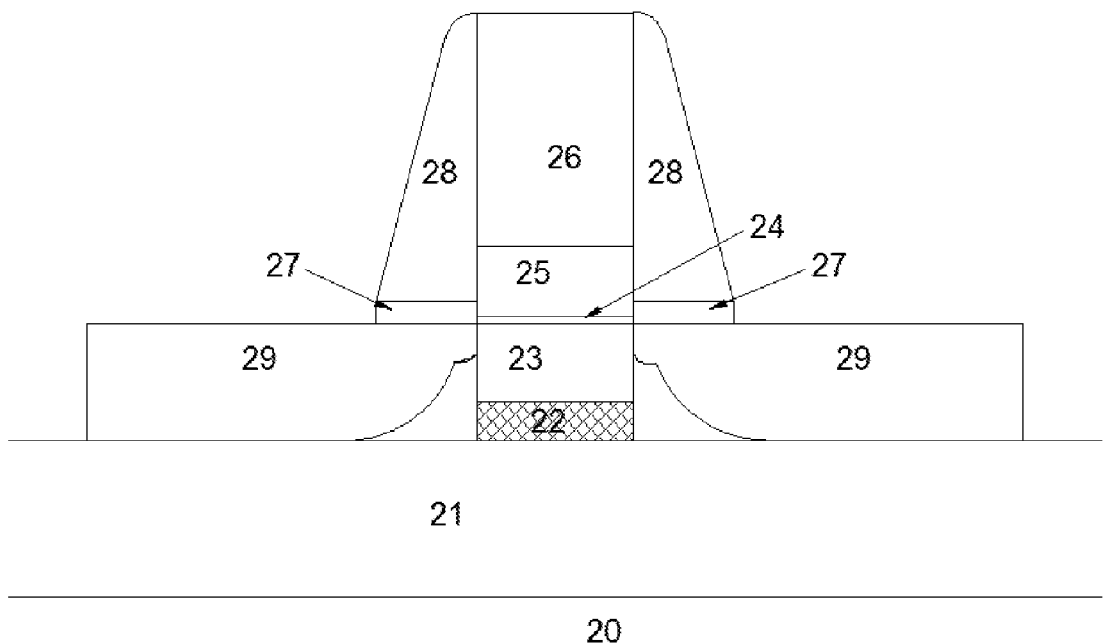
FIG. 2 is a schematic cross section of a transistor reflecting the structural improvements in this invention.

One way to realize the structure in FIG. 2 is by a "Channel Last" process. This is illustrated in the exemplary and non-limiting sequence of twelve cross-section images identified as FIGS. 3A through 3L. The series of schematic cross sections, that have the orientation that is the same as in FIG. 2, show a series of steps that intended to realize the improved transistor structure described hereinabove.

Figure 3A:
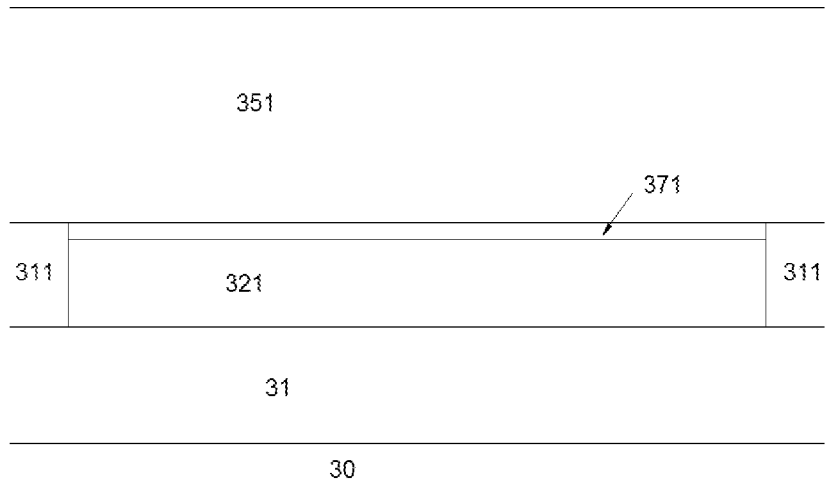
FIGS. 3A through 3L show a processing sequence by which the "Channel Last" structure can be built to realize the structural and performance improvements to fully depleted SOI transistors as described herein.

FIG. 3A shows a substrate 30, and above that there is a buried oxide 31. Region 33 is single crystal silicon, typically between 10 nm and 30 nm thick, and in an embodiment of the invention is at least twice as thick as layer 331. For the purposes of the ongoing illustration, it will be assumed, without limiting the scope of the invention, to be 15 nm thick. (It should be noted that in conventional FDSOI this layer would be much thinner; for example for a 22 nm technology, the thickness would be 5 to 6 nm.) Ultimately, the extra thickness can be used to enhance the source and drain conductance. The silicon region 33 is defined in its extents by isolation 311. The boundaries between silicon 33 and isolation 311, as shown in FIG. 3A, define the overall length of silicon required for the transistor, which comprises a source region, a channel region and a drain region, which are described in the succeeding illustrations herein below. Perpendicular to the plane of FIGS. 3A-3L, the silicon region 33 has a width of the channel width of the transistor. The silicon region 33 may be undoped, or it might be doped p-type for NMOS transistors or doped n-type for PMOS transistors. Typical maximum doping levels for the silicon 33 are $5 \times 10^{18}$ ions/cm$^3$ or even slightly higher. Above the silicon region 33, there is a layer of silicon dioxide 371.

In a full process flow involving a variety of transistors, this oxide plays various roles. For the purposes of this explanation, it is referred to as a screen oxide. The thickness of this oxide is not critical for the present explanation, but it is assumed to be 3 nm thick, without limiting the scope of the invention. Overlying everything else there is a layer 351 of amorphous (preferably) or polycrystalline silicon. This layer is not to scale in the drawings, because it can range from 50 nm to 150 nm in thickness. Its thickness is not critical to the explanations that follow. These procedures are well known to practitioners of SOI semiconductor fabrication.

Figure 3B:
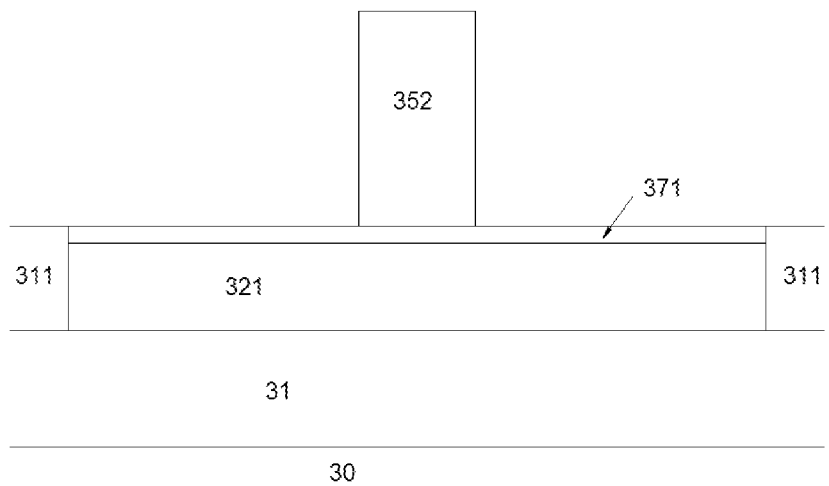

In FIG. 3B the amorphous silicon layer 361 is selectively etched, using standard photo, electron beam or X-ray masking techniques to leave a sacrificial gate structure 352. As viewed in FIG. 3B, the width of element 352 defines the eventual channel length of the thin film transistor. This procedure is well known to practitioners of SOI semiconductor fabrication.

Figure 3C:
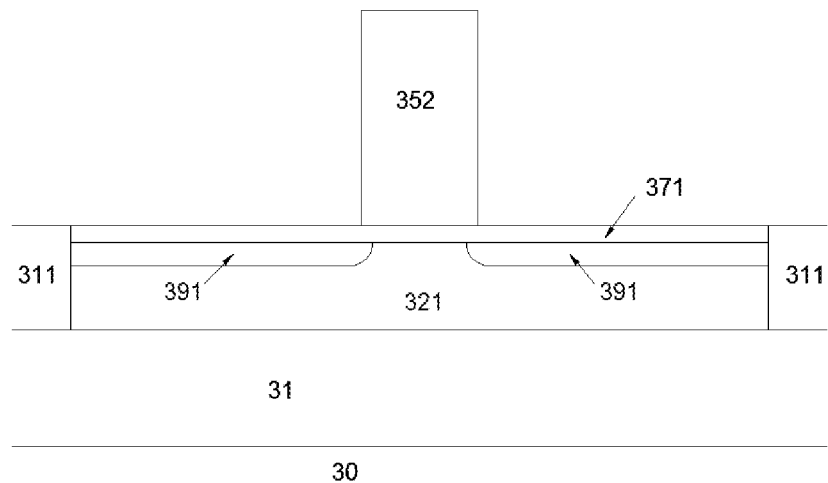

FIG. 3C shows the addition of an ion implantation 391. This implantation is typically known as a drain extension, and it is a very shallow implantation of donors, e.g., phosphorus, arsenic or antimony, for NMOS transistors or acceptors, e.g., boron $BF_2^+$ or indium, for PMOS transistors. The dose in this implantation is in an intermediate range, preferably around $1 \times 10^{14}$ ions/cm$^2$, and its energy is such that it is confined to a layer depth of 5 to 10 nm in the silicon. It should be noted that the implant is localized and excluded from the channel region by the masking effect of the sacrificial gate 352. According to other details of the transistor design, this implant may be accompanied by other implants which are designed to mitigate short channel effects in conventional transistors. Besides the local definition by the sacrificial gate, drain extension implants are dedicated to specific classes of transistors by photoresist masking. These procedures are well known to practitioners of SOI semiconductor fabrication.

Figure 3D:
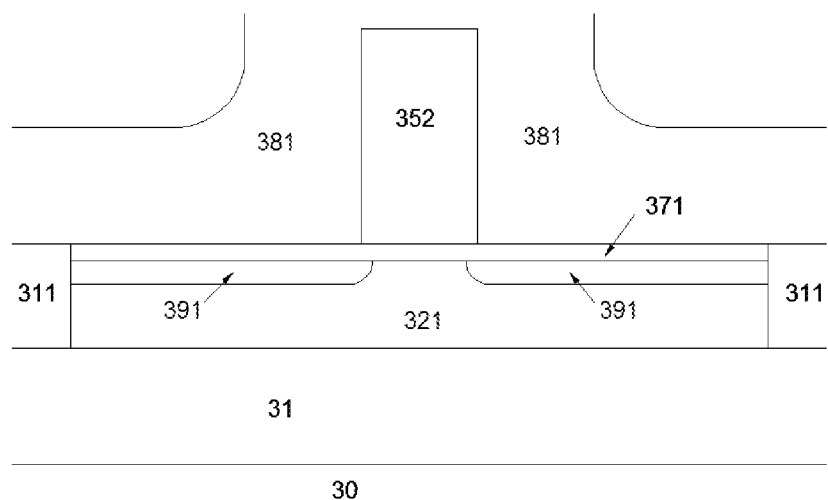

FIG. 3D shows the deposition of dielectric layer 381. This layer is typically silicon nitride, and it may be deposited by either chemical vapor deposition (CVD) or plasma enhanced CVD. The latter process is preferred in order to preclude crystal growth in the sacrificial gate 352. This is the material that provides the spacers 18 and 28 shown in FIG. 1 and FIG. 2 respectively. This thickness of layer 381 will determine in large part the eventual width of the spacers. Typical thicknesses might range from 10 nm to 200 nm. This procedure is well known to practitioners in SOI semiconductor fabrication.

Figure 3E:
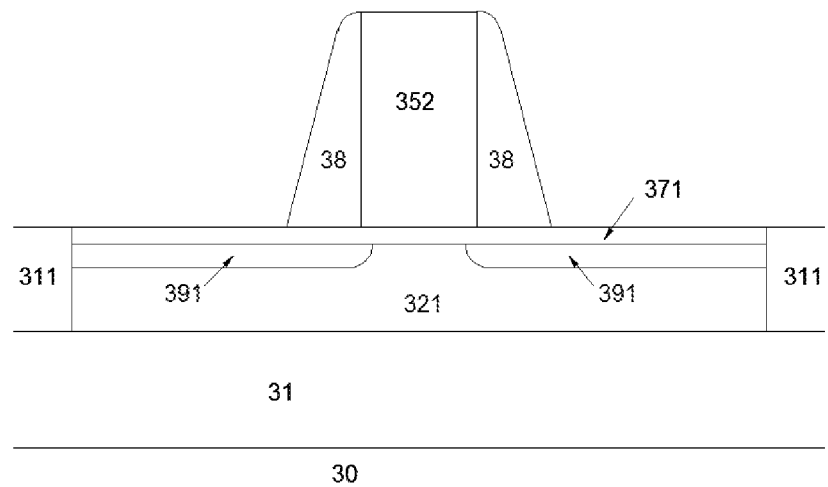

FIG. 3E shows the effect of anisotropic etching of layer 381. Where the surface of layer 381 was flat, the material 381 is cleared, but where it covers a vertical surface, there is a wedge 38 of material left. This is commonly known as a gate spacer. This procedure is well known to practitioners in SOI semiconductor fabrication.

Figure 3F:
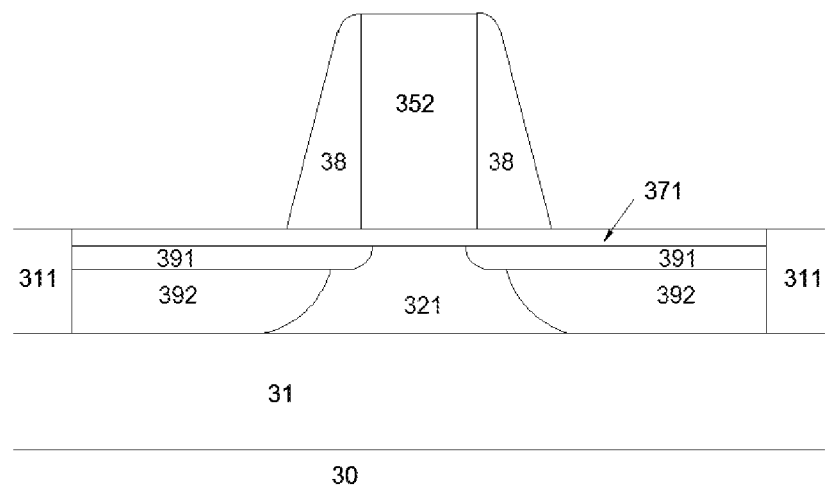

FIG. 3F shows the addition of heavy source and drain implants 392. These implants are typically the heaviest implants in the process flow, and are of the order of $1 \times 10^{15}$ ions/cm$^2$ or higher. The implants use phosphorus or arsenic for NMOS transistors and boron (sometimes as $BF_2^+$) for PMOS transistors. Within each specific transistor, this implant is localized by the masking effect of the spacers 38 and the sacrificial gate 352. The dose and energy of this implant are typically tailored to assure that it reaches through the silicon 33 after activation. After this implant and other related implants are done, they are all activated by one of various rapid thermal annealing processes, e.g., tungsten halogen, xenon flash or laser heating. This procedure is well known to practitioners in SOI semiconductor fabrication.

Figure 3G:
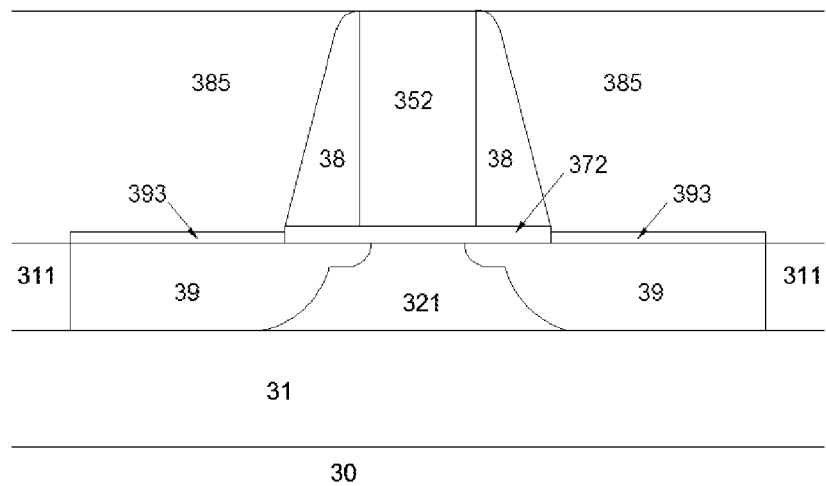

FIG. 3G shows the consequence of several steps. First, the screen oxide 371 is removed by either wet or dry etching except where it is protected by the spacers 38 and the sacrificial gate 352, leaving the remaining piece 372 of the screen oxide. After that a reactive metal, typically nickel is deposited, then heated to form a highly conductive metal-silicide layer 393. This is one typical method of enhancing the conductivity of the sources and drains 39 of the transistors. An alternative procedure, not otherwise illustrated here, involves using epitaxial growth on the surface characterized by label 393 to significantly increase the thickness and conductivity of the thin sources and drains. After the source and drain 39 conductivity enhancement is complete, a dielectric layer 385 is deposited, typically by plasma enhanced CVD. Layer 385 is the first interlayer dielectric. After deposition, layer 385 is planarized by chemical-mechanical polishing (CMP). This exposes the top of the sacrificial gate 352. These procedures are well known to practitioners in SOI semiconductor fabrication.

Figure 3H:
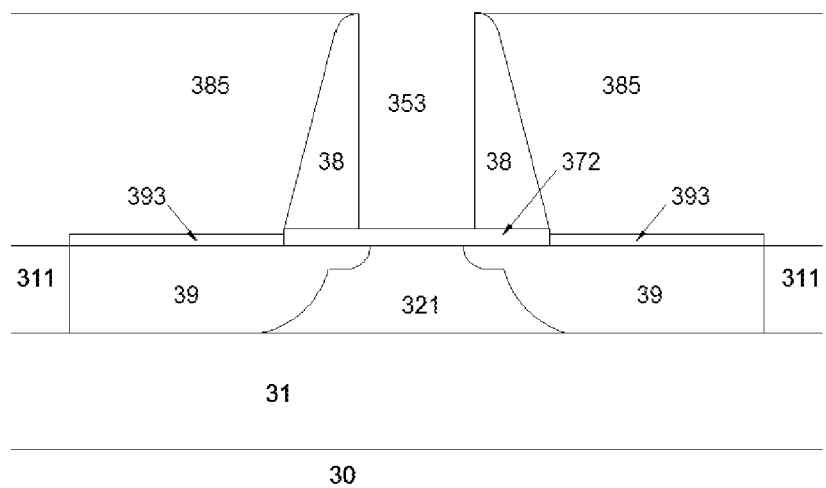

At this stage, as shown by FIG. 3H, the sacrificial gate is selectively etched away, leaving a cavity identified as region 353. This step is commonly used in the class of processes known as "Gate Last' processes.

Figure 3I:
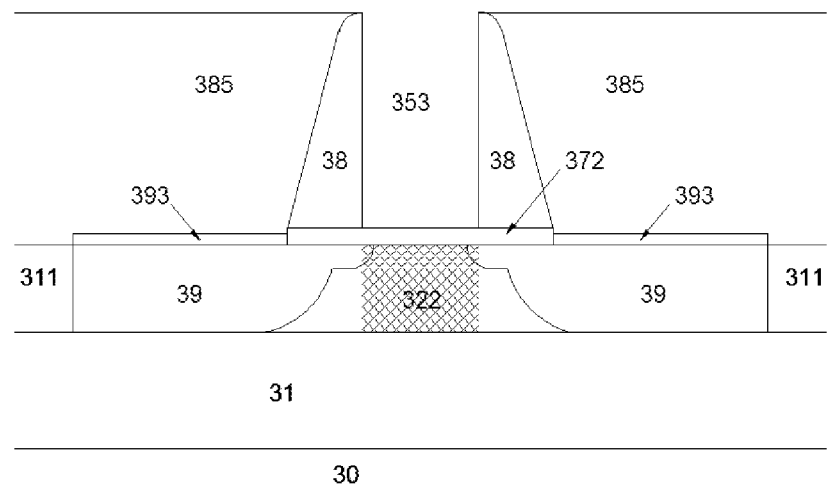

FIG. 3I shows the cross-section after ion implantation that is used to create region 322. This implantation is masked from other parts of the transistor by the combination of the spacers 38 and the first interlayer dielectric 385. It goes through the screen oxide 372.

This implant is typically designed to have its peak doping density at or near the boundary between the silicon 322 and buried oxide 31. For NMOS transistors the implanted ions will be acceptors like boron or indium. For PMOS transistors the implanted ions will be donors like phosphorus or arsenic.

The dose of this implant is selected to realize a doping density between $5\times10^{18}$ ions/cm$^3$ and $1\times10^{20}$ ions/cm$^3$ at the boundary with the buried oxide 31.

This implant makes it possible to customize the threshold voltage of the transistors, so one class of transistor might receive a lighter implant, while another class, intended to have a threshold voltage of greater magnitude, receives a heavier implant. After all implants of this type are completed, they need to be activated. At this stage, with the silicide layer 393 in place, the activation has to be done with the least possible heating of the substrate. That typically means that fast laser activation is indicated, although other rapid thermal processes may be used without departing from the scope of the invention.

Figure 3J:
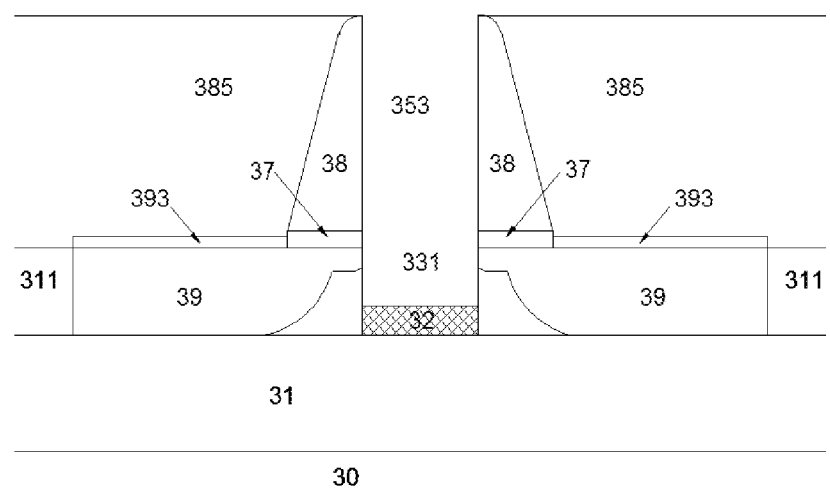

FIG. 3J depicts a cross-section after etching into the implanted layer 322. After etching away the screen oxide 372, leaving just those portions 37 beneath the spacers 38, a recess 331 is etched to controlled depth between 5 nm and 15 nm. For the discussion here a depth of 10 nm will be assumed. Creating this recess is the first part of making this a "Channel Last" process. The sidewalls 38 act as hard masks to define the lateral extent of the etches illustrated in FIG. 3J. Note that this etch eliminates any irregularities in the diffusion boundary between the drain extensions 39 and the eventual channel. The remaining silicon region 32 represents part of the seed region for the epitaxial growth in the next step, and it holds the charge that helps define the transistor's threshold voltage. In this example, it is 5 nm thick, so its effective charge is in a range from $2.5\times10^{12}$/cm$^2$ to $5\times10^{13}$/cm$^2$ for the peak doping density ranges cited above.

Figure 3K:
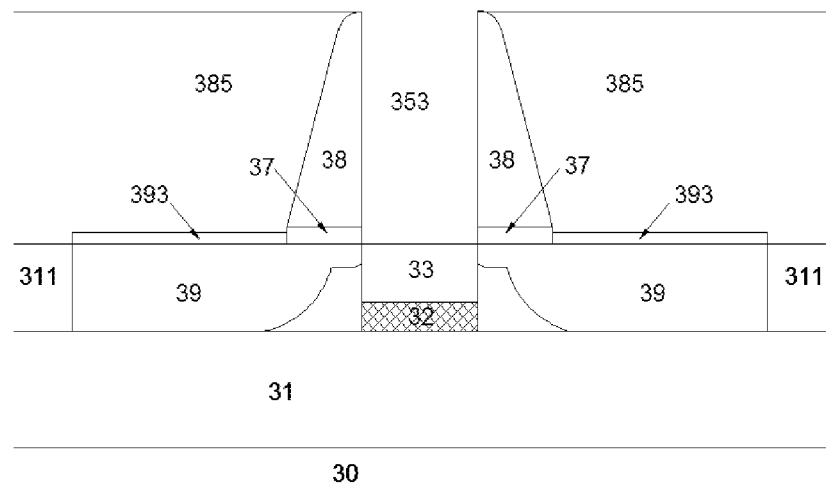

The next step in creating a Channel Last process is shown in FIG. 3K. The recess 331 is refilled by epitaxially growing region 33, which is the channel region. Besides its crystalline integration with the surrounding silicon, there are two other critical factors about this epi region: 1) It must be grown at a very low temperature, preferably not exceeding 650° C., and 2) it should have essentially zero doping, certainly not to exceed $1\times10^{17}$ ions/cm$^3$. The low temperature epi is important because the efficacy of this structure in reducing threshold voltage fluctuations is greatest when the boundary between high doping and zero doping is perfectly abrupt; high temperature processing softens that interface through thermal diffusion. The low doping in the epi layer is important because each time there is an ionized dopant in that region it causes a deviation of the threshold voltage from its nominal value.

While silicon is the preferred constituent material of epitaxially formed region 33, other materials may be used. Silicon:germanium alloys are commonly used in advanced semiconductor devices, and even pure germanium is a possibility. Certain III-V compounds may also be grown satisfactorily in this small volume.

Figure 3L:
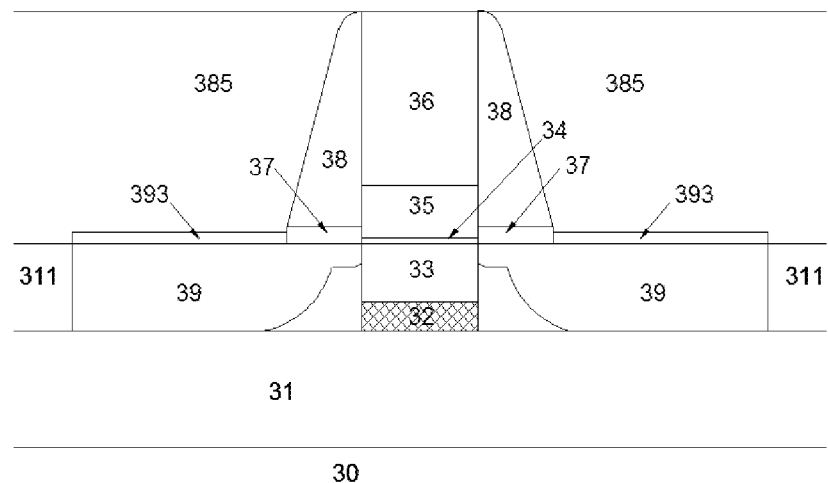

The transistor is completed like any other "Gate Last" transistor as shown in FIG. 3L. A High-K dielectric stack 34 is first deposited over the channel epitaxial layer 33. This stack may have one or more layers, and its effective dielectric constant will be 6 or more. Its effective oxide thickness, a frequently used measure of electrical thickness, will be 1 nm or less. Various compounds are employed in the High-K dielectric stack, but most include compounds of hafnium, as $HfO_2$, HfON, HfLaO and others. The next layer in FIG. 3L is a metal gate 35, which is formulated to achieve specific work functions in order to set the threshold voltage. This layer is typically from 50 nm to 150 nm thick, and it may consist of one or more layers of metallic materials. One commonly used metallic material is TiN, but hafnium, ruthenium, TaN, MoN and WN also arise as candidates. The final material is a gate handle 36, which is typically amorphous or poly-crystalline silicon. This material protects the underlying metal from chemical or mechanical damage. After all of layers 34, and 36 have been deposited, it is normal to use CMP to restore the planar surface of the first interlayer dielectric 385. All of the steps associated with FIG. 3L are well known to practitioners of High-K, metal gate semiconductor science and engineering.

It is well known that, subsequent to forming the structure shown in FIG. 3K, other steps are necessary to complete the integrated circuit. These include adding a second interlayer dielectric, creating contacts, and adding multiple layers of metal interconnect.

The exemplary and non-limiting sequence of FIGS. 4A through 4D give an abbreviated explanation of an alternative method of creating the structure shown in FIGS. 2 and 3L. This approach delays the implant until after the recess is etched in the silicon layer.

Figure 4A:
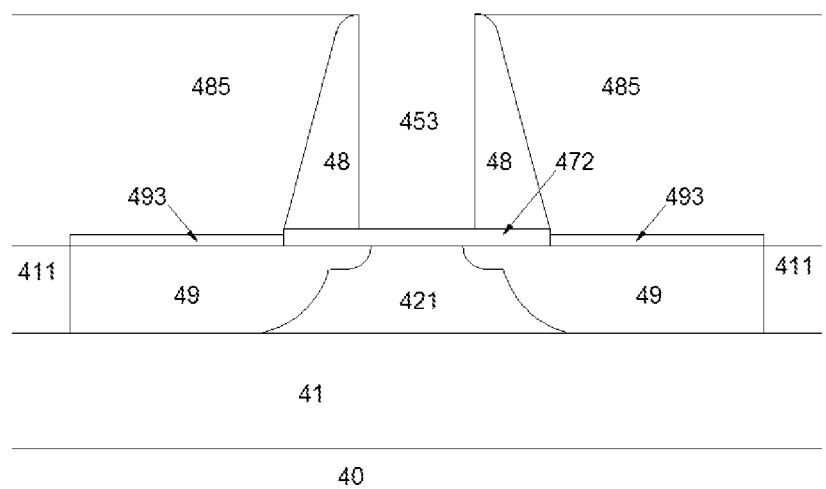
FIGS. 4A through 4D show an alternative method of realizing the "Channel Last" structure that realizes the structural and performance improvements to fully depleted SOI transistors as describe herein.

FIG. 4A shows the schematic cross section of the transistor after the sources and drains have been completely formed, the first interlayer dielectric has been deposited and planarized, and the sacrificial gate has been etched away. The components of FIG. 4A include the substrate 40, the buried oxide 41, isolation oxide regions 411, silicon film 421 in which the transistor is being formed, the cavity 453 from which the sacrificial gate has been removed, the screen oxide 472, sidewall spacers 48, first interlayer dielectric 485, source/drain regions 49 and source drain silicide 493.

Figure 4B:
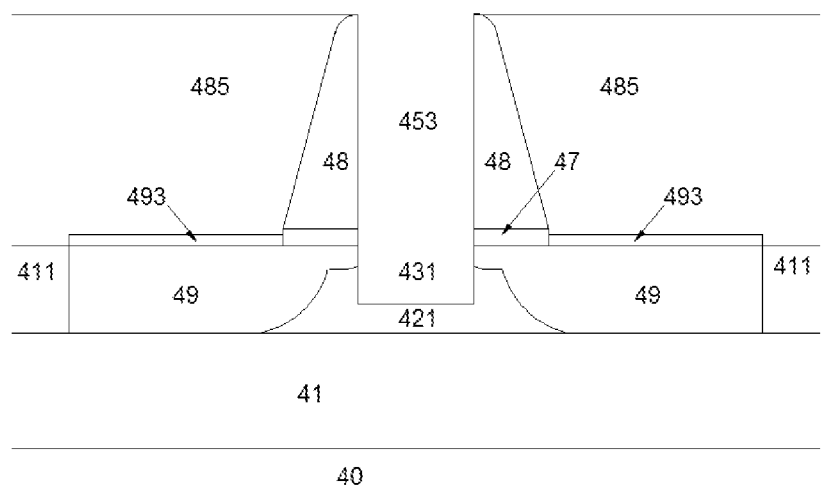

FIG. 4B shows the sacrificial oxide 472 etched to leave segments 47 under the spacers 48. Then the recess 431 is etched into the underlying silicon 421 to a controlled depth between 5 nm and 15 nm. It should be noted that this etch eliminates any irregularities in the diffusion boundary between the drain extensions 49 and the eventual channel.

Figure 4C:
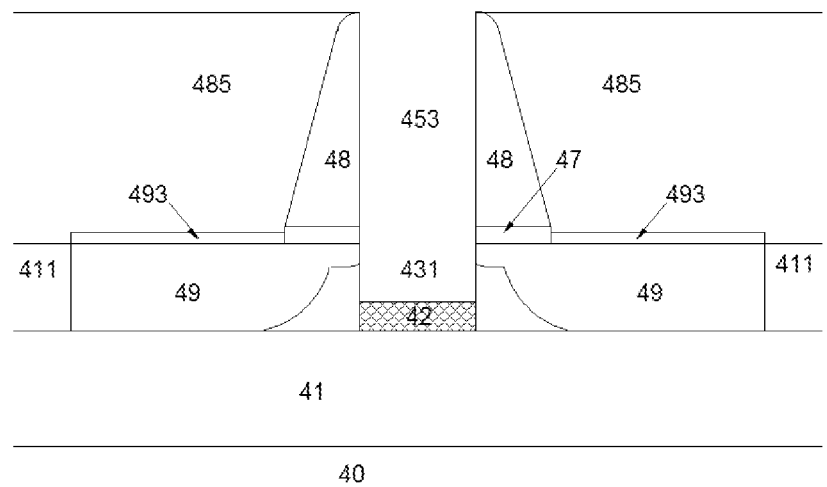

FIG. 4C shows the region beneath the recess 431 implanted with acceptors for NMOS transistors or donors for PMOS transistors. The fact that region 42 is so thin implies that the energy of this implant should be very low, so that the peak of the distribution lies within the that layer. As before the expected doping density is in the range of $5\times10^{18}$ ions/cm$^3$ to $1\times10^{20}$ ions/cm$^3$. This implant makes it possible to customize the threshold voltage of the transistors. At this stage, the implant must be activated using the least possible wafer heating. Among the rapid thermal processing treatments available, laser activation is the most likely candidate.

Figure 4D:
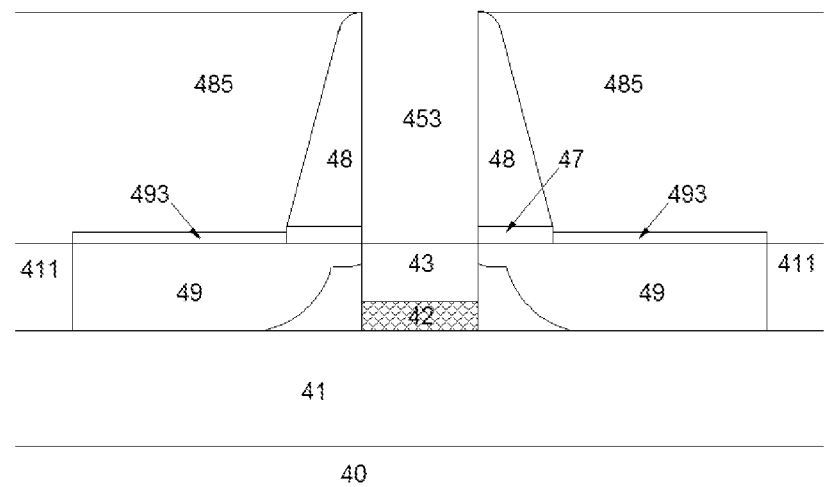

In FIG. 4D, the channel is formed by epitaxially growing zero-doped, certainly less than $1\times10^{17}$ ions/cm$^3$, silicon, silicon:germanium or other appropriate semiconductor to fill the recess forming region 43. It is important that this epitaxial layer is grown at a low temperature in order to preserve a very steep gradient between the heavily doped region 42 and the zero-doped region 43.

Subsequent to completing the growth of the zero-doped region 43, the transistor is completed using the well-known "Gate Last" process sequence. This includes deposition of a high-K gate stack, deposition of a work-function controlled metallic layer, and deposition of a robust gate handle material. After CMP, a second interlayer dielectric, contacts and the interconnect structures complete the integrated circuit.

It will be appreciated that there are a variety of approaches to realizing a structure possessing the essential properties of the "Channel Last" SOI transistor described hereinabove. The resulting structure has a superior opportunity for threshold definition. For a given threshold voltage, it has a lower magnitude of threshold fluctuation due to random doping variations. Because most of the structure beneath the gate has no doping, it is possible to make the transistor film thicker than a uniformly doped, fully depleted structure. A thicker film means that the mechanical tolerances are somewhat relaxed and that the source and drain structures can have lower resistances. Because the drain edge is defined by the etch that creates a recess in the silicon, wide variations of effective channel length are avoided.

A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to two specific embodiments, one skilled-in-the-art will readily appreciate that other applications may be substituted for those set forth herein without departing from the spirit and scope of the present invention. Accordingly, the invention should only be limited by the claims included below.

What is claimed is:

1. A method of forming a MOSFET comprising:
   providing an underlying substrate with a buried oxide layer thereon and a first semiconductor layer on the buried oxide layer;
   forming a sacrificial gate structure above a region designated to be the transistor channel;
   creating source and drain structures in the first semiconductor layer comprising source and drain extensions, sidewall spacers adjacent the sacrificial gate, and highly conductive source and drain regions contacting the source and drain extensions, respectively;
   etching away the sacrificial gate structure;
   implanting in the first semiconductor layer aligned with and below the sidewall spacers, a doped region adjacent and extending to the buried oxide layer, that comprises forming the doped region by ion implantation using the sidewall spacers as a mask, and etching away part of the first semiconductor layer by an anisotropic process using the gate spacers as a mask;
   epitaxially growing a semiconductor channel region in a recess in the first semiconductor layer over the doped region of a first doping level that extends to the buried oxide layer, the recess being formed by anisotropic processes using the gate spacers as a mask;
   depositing a dielectric stack over the epitaxially grown semiconductor channel region; and,
   depositing a conductive gate over the dielectric stack;
   wherein epitaxially growing a semiconductor channel region in the recess and all subsequent processes are low temperature processes not subjecting the MOSFET to temperatures exceeding 650° C.

2. The method of claim 1 wherein implanting of the doped region in the first semiconductor layer aligned with and below the sidewall spacers precedes the etching away part of the first semiconductor layer by an anisotropic process using the gate spacers as a mask.

3. The method of claim 1 wherein the implanting of the doped region by ion implantation using the sidewall spacers as a mask follows the etching away part of the first semiconductor layer by an anisotropic process using the gate spacers as a mask.

4. The method of claim 1 wherein etching away the sacrificial gate structure includes etching a recess in the first semiconductor layer using the sidewall spacers as a mask, the recess not extending to the buried oxide layer, and wherein the doped region adjacent and extending to the buried oxide layer is formed by implantation after the recess is formed.

5. The method of claim 1 wherein the source and drain regions extend through the first semiconductor layer to the buried oxide layer.

6. The method of claim 5 wherein the dielectric stack has an effective dielectric constant of at least 6.

7. The method of claim 1 further comprising depositing a conductive gate handle over the metal gate.

8. The method of claim 1 wherein the metal gate is formulated for specific work functions to set the threshold voltage of the MOSFET.

9. The method of claim 8 wherein the semiconductor channel region is germanium or silicon-germanium.

10. The method of claim 1 wherein the doping in the doped region adjacent and extending to the buried oxide layer is one of: acceptors for an N-type MOSFET or donors for a P-type MOSFET.

11. The method of claim 1 wherein the doping in the semiconductor channel region is in the range of undoped to not exceeding $10^{17}$ doping ions/cm$^3$.

12. The method of claim 1 wherein the semiconductor channel region is undoped.

13. The method of claim 1 wherein the first semiconductor layer and the semiconductor channel region are silicon.

14. A method of forming a MOSFET comprising:
   providing an underlying substrate with a buried oxide layer thereon and a first semiconductor layer on the buried oxide layer;
   providing a second oxide layer over the first semiconductor layer;
   forming a sacrificial gate structure on the second oxide layer;
   implanting through the second oxide layer a source extension on one side of the sacrificial gate structure and a drain extension on a second side of the sacrificial gate structure opposite the first side of the sacrificial gate structure;
   depositing a first dielectric layer over the top of the second oxide layer and the sacrificial gate structure;
   anisotropically etching the first dielectric layer to form gate sidewall spacers;
   implanting, through the second oxide layer, source and drain regions which connect to the source and drain extensions;
   removing the exposed regions of the second oxide layer;
   depositing a second dielectric layer over the second oxide layer, the gate spacers and the sacrificial gate structure;
   etching away the sacrificial gate structure;
   implanting in the first semiconductor layer aligned with and below the sidewall spacers, a doped region adjacent and extending to the buried oxide layer and precedes the etching away part of the first semiconductor layer by an anisotropic process using the gate spacers as a mask;
   epitaxially growing a semiconductor channel region in a recess in the first semiconductor layer over the doped region adjacent that extends to the buried oxide layer, the recess being formed by anisotropic processes using the gate spacers as a mask, the epitaxial channel region having a second doping level lower than the first doping level;
   depositing a dielectric stack over the epitaxially grown semiconductor channel region; and,
   depositing a metal gate over the dielectric stack;
   the epitaxially growing a semiconductor channel region in the recess over the second semiconductor layer and all succeeding steps being low temperature processes not subjecting the MOSFET to temperatures exceeding 650° C.

15. The method of claim 14 wherein the implanting of the doped region by ion implantation using the sidewall spacers as a mask follows the etching away part of the first semiconductor layer by an anisotropic process using the gate spacers as a mask.

16. A method of forming a MOSFET comprising:
providing an underlying substrate with a buried oxide layer thereon and a first semiconductor layer on the buried oxide layer;
forming a sacrificial gate structure above a region designated to be the transistor channel;
creating source and drain structures in the first semiconductor layer comprising source and drain extensions, sidewall spacers adjacent the sacrificial gate, and highly conductive source and drain regions contacting the source and drain extensions, respectively;
etching away the sacrificial gate structure including etching a recess in the first semiconductor layer using the sidewall spacers as a mask, the recess not extending to the buried oxide layer, and wherein the doped region adjacent and extending to the buried oxide layer is formed by implantation after the recess is formed;
implanting in the first semiconductor layer aligned with and below the sidewall spacers, a doped region adjacent and extending to the buried oxide layer;
epitaxially growing a semiconductor channel region in a recess in the first semiconductor layer over the doped region of a first doping level that extends to the buried oxide layer, the recess being formed by anisotropic processes using the gate spacers as a mask;
depositing a dielectric stack over the epitaxially grown semiconductor channel region; and,
depositing a conductive gate over the dielectric stack;
wherein epitaxially growing a semiconductor channel region in the recess and all subsequent processes are low temperature processes not subjecting the MOSFET to temperatures exceeding 650° C.

17. The method of claim 16 wherein forming in the first semiconductor layer aligned with and below the sidewall spacers, a doped region adjacent and extending to the buried oxide layer comprises forming the doped region by ion implantation using the sidewall spacers as a mask, and etching away part of the first semiconductor layer by an anisotropic process using the gate spacers as a mask.

18. The method of claim 17 wherein implanting of the doped region in the first semiconductor layer aligned with and below the sidewall spacers precedes the etching away part of the first semiconductor layer by an anisotropic process using the gate spacers as a mask.

19. The method of claim 17 wherein the implanting of the doped region by ion implantation using the sidewall spacers as a mask follows the etching away part of the first semiconductor layer by an anisotropic process using the gate spacers as a mask.

20. The method of claim 16 wherein the source and drain regions extend through the first semiconductor layer to the buried oxide layer.

21. The method of claim 20 wherein the dielectric stack has an effective dielectric constant of at least 6.

22. The method of claim 16 further comprising depositing a conductive gate handle over the metal gate.

23. The method of claim 16 wherein the metal gate is formulated for specific work functions to set the threshold voltage of the MOSFET.

24. The method of claim 23 wherein the semiconductor channel region is germanium or silicon-germanium.

25. The method of claim 16 wherein the doping in the doped region adjacent and extending to the buried oxide layer is one of: acceptors for an N-type MOSFET or donors for a P-type MOSFET.

26. The method of claim 16 wherein the doping in the semiconductor channel region is in the range of undoped to not exceeding $10^{17}$ doping ions/cm$^3$.

27. The method of claim 16 wherein the semiconductor channel region is undoped.

28. The method of claim 16 wherein the first semiconductor layer and the semiconductor channel region are silicon.

29. A method of forming a MOSFET comprising:
providing an underlying substrate with a buried oxide layer thereon and a first semiconductor layer on the buried oxide layer;
providing a second oxide layer over the first semiconductor layer;
forming a sacrificial gate structure on the second oxide layer;
implanting through the second oxide layer a source extension on one side of the sacrificial gate structure and a drain extension on a second side of the sacrificial gate structure opposite the first side of the sacrificial gate structure, the implant using the sidewall spacers as a mask follows the etching away part of the first semiconductor layer by an anisotropic process using the gate spacers as a mask;
depositing a first dielectric layer over the top of the second oxide layer and the sacrificial gate structure;
anisotropically etching the first dielectric layer to form gate sidewall spacers;
implanting, through the second oxide layer, source and drain regions which connect to the source and drain extensions;
removing the exposed regions of the second oxide layer;
depositing a second dielectric layer over the second oxide layer, the gate spacers and the sacrificial gate structure;
etching away the sacrificial gate structure;
implanting in the first semiconductor layer aligned with and below the sidewall spacers, a doped region adjacent and extending to the buried oxide layer;
epitaxially growing a semiconductor channel region in a recess in the first semiconductor layer over the doped region adjacent that extends to the buried oxide layer, the recess being formed by anisotropic processes using the gate spacers as a mask, the epitaxial channel region having a second doping level lower than the first doping level;
depositing a dielectric stack over the epitaxially grown semiconductor channel region; and,
depositing a metal gate over the dielectric stack;
the epitaxially growing a semiconductor channel region in the recess over the second semiconductor layer and all succeeding steps being low temperature processes not subjecting the MOSFET to temperatures exceeding 650° C.

30. The method of claim 29 wherein implanting of the doped region in the first semiconductor layer aligned with and below the sidewall spacers precedes the etching away part of the first semiconductor layer by an anisotropic process using the gate spacers as a mask.

* * * * *